(12) United States Patent
Tamaru et al.

(10) Patent No.: US 7,584,211 B2
(45) Date of Patent: Sep. 1, 2009

(54) PARTS LIST SYSTEM FOR MANAGING PARTS USED FOR UNIT AND A METHOD OF PREPARING A PARTS LIST

(75) Inventors: Katsuki Tamaru, Saitama (JP); Kazunori Suzuki, Saitama (JP); Masataka Yamamoto, Saitama (JP); Hideyuki Tanaka, Saitama (JP); Mikiya Fujita, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 837 days.

(21) Appl. No.: 10/402,291

(22) Filed: Mar. 28, 2003

(65) Prior Publication Data

US 2003/0187879 A1 Oct. 2, 2003

(30) Foreign Application Priority Data

Mar. 29, 2002 (JP) ............................. 2002-098070

(51) Int. Cl.
*G06F 7/00* (2006.01)
(52) U.S. Cl. ..................... 707/104.1; 707/1; 707/2; 707/100; 700/95; 700/97; 703/1
(58) Field of Classification Search ................. 707/104, 707/104.1
See application file for complete search history.

(56) References Cited

U.S. PATENT DOCUMENTS 5,119,307 A 6/1992 Blaha et al.
5,202,836 A 4/1993 Iida et al.
5,742,288 A 4/1998 Nishizaka et al.
5,777,877 A 7/1998 Beppu et al.
5,822,210 A * 10/1998 Kobayashi et al. .......... 700/121

(Continued)

FOREIGN PATENT DOCUMENTS

EP 0 467 257 A2 1/1992

(Continued)

OTHER PUBLICATIONS

Shaw C. Feng, Manufacturing Planning and Execution Software Interfaces, 2000, Journal of Manufacturing Systems, vol. 19/No.

(Continued)

*Primary Examiner*—Hung Q Pham
(74) *Attorney, Agent, or Firm*—Carrier, Blackman & Associates, P.C.; Joseph P. Carrier; William D. Blackman

(57) ABSTRACT

A parts list system includes a figure generator, a information database, a figure controller, a part table database and a part table controller. The figure generator generates a CAD figure relating to a unit which includes a plurality of parts, the CAD figure containing at least a figure of the unit and first character strings. The information database stores an attribute of at least a second character string relating to each of the plurality of parts. The figure controller extracts a third character string from the first character strings, the third character string corresponding to the attribute of the second character string. The part table database stores a parts list for managing the parts used for the unit. The part table controller registers the third character strings on the parts list.

16 Claims, 9 Drawing Sheets

U.S. PATENT DOCUMENTS

| | | | |
|---|---|---|---|
| 5,838,965 A * | 11/1998 | Kavanagh et al. | 707/103 R |
| 5,864,875 A * | 1/1999 | Van Huben et al. | 707/200 |
| 6,185,476 B1 * | 2/2001 | Sakai | 700/182 |
| 6,336,053 B1 | 1/2002 | Beatty et al. | |
| 6,438,535 B1 | 8/2002 | Benjamin et al. | |
| 6,557,002 B1 | 4/2003 | Fujieda et al. | |
| 6,662,179 B2 | 12/2003 | Benjamin et al. | |
| 7,209,930 B2 * | 4/2007 | Maeda et al. | 707/104.1 |
| 2001/0007997 A1 | 7/2001 | Fujieda | |
| 2001/0016803 A1 | 8/2001 | Sartiono et al. | |
| 2001/0042030 A1 | 11/2001 | Ito et al. | |
| 2003/0004988 A1 * | 1/2003 | Hirasawa et al. | 707/502 |
| 2003/0055812 A1 | 3/2003 | Williams et al. | |
| 2003/0084019 A1 | 5/2003 | Woodmansee | |
| 2003/0103083 A1 * | 6/2003 | Denny et al. | 345/771 |
| 2003/0187870 A1 | 10/2003 | Nakajima et al. | |
| 2003/0212766 A1 | 11/2003 | Giles et al. | |
| 2004/0098292 A1 | 5/2004 | Miller et al. | |

FOREIGN PATENT DOCUMENTS

| | | |
|---|---|---|
| JP | 06-162036 | 6/1994 |
| JP | 09-204449 | 8/1997 |
| JP | 10-124550 | 5/1998 |
| JP | 2000-202746 | 7/2000 |
| JP | 2002-073708 | 3/2002 |

OTHER PUBLICATIONS

Tony Valente, Product data management; It's more than just the latest fad, Printed Circuit Design, v18n1, p. 22-26, Jan. 2001.

Integration of the STEP-based assembly model and XML schema with the fuzzy analytical hierarchy process (FAHP) for multi-agent based assembly evaluation, Journal of Intelligent Manufacturing, V17n5, p. 527, Oct. 2006.

Jeanine, Katzel, A plant engineer's guide to microcomputer applications software, Plant Engineering, vol. 39, p. 48(24), Jun. 27, 1985.

\* cited by examiner

Fig. 4

| NO | DWG. NO | NAME | MATERIAL | REMARKS | DWG | SP | M. DWG | QTY A | QTY B | SP. QTY A | SP. QTY B |
|---|---|---|---|---|---|---|---|---|---|---|---|
| 1 | | PART NAME | | | × | × | | 1 | 1 | 1 | 1 |
| 2 | 00000-XXXX-0000 | PART NAME | | (C) | ○ | ○ | | 1 | 1 | 1 | 1 |
| 3 | 00000-XXXX-0000 | PART NAME | | | ○ | × | | 1 | 1 | 1 | 1 |
| 4 | | PART NAME | | | × | × | | 1 | 1 | 1 | 1 |
| SET SHORT PART | | | | | | | | | | | |
| 700 | 00000-XXXX-0000 | PART NAME | | (C) | × | ○ | | 1 | 1 | * | |
| 701 | 00000-XXXX-0000 | PART NAME | | | × | ○ | | 1 | 1 | | * |

Fig. 5

| PART NUMBER | TITLE COLUMN | ... | CONFIGURATION PART COLUMN | ... | CAD DATA |
| --- | --- | --- | --- | --- | --- |
| | TITLE COLUMN PART NUMBER | PART NAME | CONFIGURATION NUMBER | CONFIGURATION PART NUMBER | |

13-1

61 — PART NUMBER
62 — TITLE COLUMN
62-1 — TITLE COLUMN PART NUMBER
62-2 — PART NAME
63 — CONFIGURATION PART COLUMN
63-1 — CONFIGURATION NUMBER
63-2 — CONFIGURATION PART NUMBER
64 — CAD DATA

Fig. 6

| No. | LVL | STATE | PART CONFIGURATION | ITEM | PART NAME | QTY | MATERIAL | THICKNESS | WEIGHT (Kg) |
|---|---|---|---|---|---|---|---|---|---|
|  |  |  | ⊞··F01 20000 | T/F | TEST |  |  |  |  |
|  | 1 | F | ⊟··F01 20001   56-1 |  | TEST |  |  |  | 0.0 |
|  | 2 | D | ⊟··20001-TGHA-A000 |  | TEST | 2 |  |  | 0.0 |
|  |  |  | ····20001-TGHA-B000   56-2 |  | TEST |  |  |  |  |
|  | 1 | C | ⊟··F01 20002   56-3 |  | TEST |  |  |  | 0.0 |
|  | 2 | D | ⊟··20002-TGHA-A000 |  | TEST | M |  |  | 0.0 |
|  |  |  | ····20002-TGHA-Z000 |  | TEST |  |  |  |  |
|  | 1 | C | ⊟··F01 20003 |  | TEST |  |  |  | 0.0 |
|  | 2 | D | ⊟··20003-TGHA-B000 |  | SPEC | M |  |  | 0.0 |
|  | 1 | F | ⊟··F01 20004 |  | TEST |  |  |  |  |
|  | 2 | D | ⊟··20004-TGHA-A000 |  | SPEC L1 |  |  |  |  |
|  |  |  | ····2004Z-TGHA-A000 |  | SPEC |  |  |  | 0.0 |
|  | 1 | G | ⊟··F01 20005 |  | TEST | M |  |  | 0.0 |
|  | 2 | B | ⊟··20005-TGHA-0000 |  | SPECC |  |  |  |  |
|  |  |  | ····2005Z-TGH-0000 |  | SPEC |  |  |  | 0.0 |
|  | 2 | B | ⊟··F01 20006 |  | SPEC |  |  |  | 0.0 |

Figure 7:
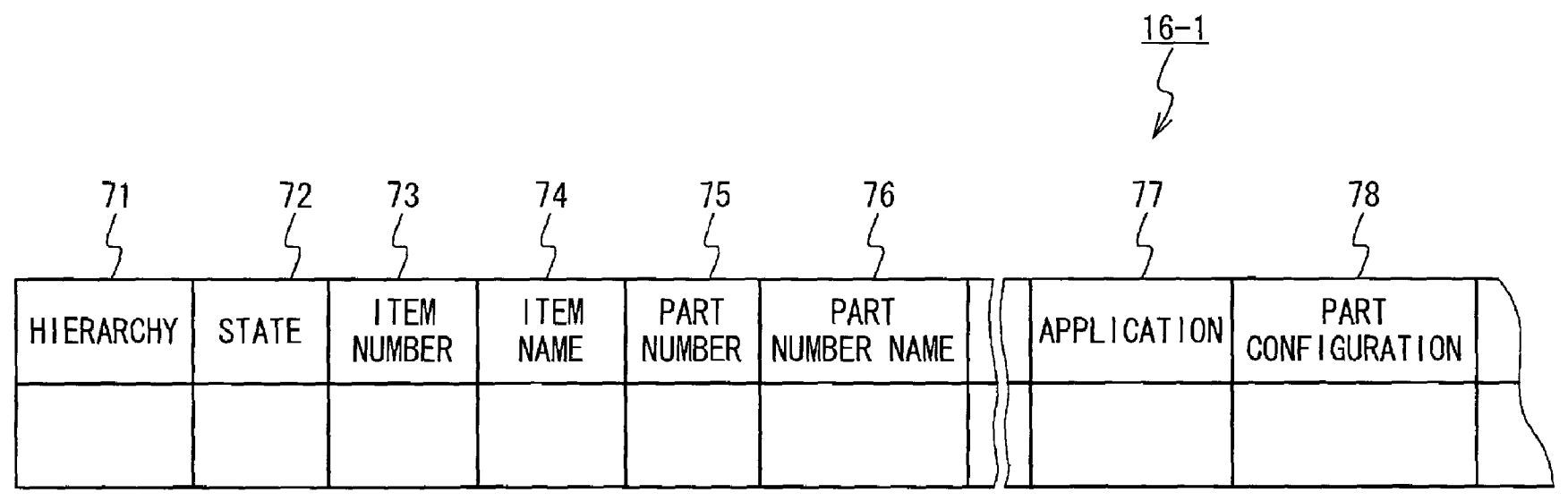

| HIERARCHY | STATE | ITEM NUMBER | ITEM NAME | PART NUMBER | PART NUMBER NAME | APPLICATION | PART CONFIGURATION |
|---|---|---|---|---|---|---|---|
| 71 | 72 | 73 | 74 | 75 | 76 | 77 | 78 |
|  |  |  |  |  |  |  |  |

PARTS LIST SYSTEM FOR MANAGING PARTS USED FOR UNIT AND A METHOD OF PREPARING A PARTS LIST

BACKGROUND OF THE INVENTION

1. Field of the Invention

The present invention relates to a parts list system for managing a part configuration of parts used for a product and the like, and a method of preparing an electronic parts list. More particularly, the present invention relates to a system for automatically registering an attribute data of a figure generated using computer aided design (CAD) in an electronic parts list, and a method of preparing an electronic parts list.

2. Description of the Related Art

In designing an apparatus such as an automobile provided with a number of complex parts, the parts are managed by using a part table system. Here, the part table is the table to manage the configuration of a master part (a part constituting the automobile) and a slave (a part constituting the master part) with regard to any item, the number of the part, the data peculiar to the part such as a design change history of the part, the assembling unit in the product, the usage state and the like, for each part. Some of data in this part table are obtained from a figure of the part.

In a conventional part table system, an operator having knowledge with regard to a part table reads an attribute data (the data used in the part table) from a paper figure first, and then uses a dedicated terminal to carry out a process for registering the attribute data in the part table. For this method, a fact that a dedicated operator is necessary, a fact that the number of the dedicated operators is limited, a fact that many input steps are required to thereby take a long time to carry out the registering process, a fact that a possibility of an input miss occurrence is inevitable and other facts are pointed out.

As another registration processing method, there is an approach for noting, on a particular element of CAD (a Comment portion in CAD), an attribute data to be noted on a typical figure, and reading the attribute data in the Comment portion through software, and then registering the attribute data in a part table. In this method, an additional input work is performed on a region except a normal input region in the figure. This may result in the increase in the number of input steps, the inevitable possibility of an input miss, and the possibility of an erroneous interpretation of a data through the software, and the like.

As still another registration processing method, there is an approach for noting, in a file different from a CAD figure, an attribute data of a figure as an electronic data, and storing the attribute data together with the CAD figure, and then reading the annexed electronic data, and automatically registering in a part table. This method, since using the additional data, has the possibilities of an inevitable occurrence of an input miss, an erroneous interpretation of a data through the software, the necessity of a system of a management step number of annexed data, and the like.

A technique is required which can carry out a process for registering the attribute data of the figure in the part table by reducing as much as possible the additional work except the preparation of the CAD figure. A technique is desired which can precisely modify and render uniform the elements in relation to the figure data on the CAD data. And, a technique is desired which can rewrite the figure data in the CAD data accurately and collectively.

SUMMARY OF THE INVENTION

Therefore, an object of the present invention is to provide a parts list system and a method of preparing an electronic parts list which can register an attribute data of a figure in a part table by reducing as much as possible an additional work except generation of a CAD figure.

Another object of the present invention is to provide a parts list system and a method of preparing an electronic parts list which can precisely modify and render uniform elements in relation to a figure data on a CAD data.

Still another object of the present invention is to provide a parts list system and a method of preparing an electronic parts list which can rewrite a figure data in a CAD data accurately and collectively.

In an aspect of the present invention, a parts list system includes a figure generator, an information database, a figure controller, a part table database and a part table controller. The figure generator generates a CAD figure relating to a unit which includes a plurality of parts. The CAD figure containing at least a figure of the unit and first character strings. The information database stores an attribute of at least a second character string relating to each of the plurality of parts. The figure controller extracts a third character string from the first character strings, the third character string corresponding to the attribute of the second character string. The part table database stores a parts list for managing the parts used for the unit. The part table controller registers the third character strings on the parts list.

Also, the attribute of the second character string is a position of the second character string of the CAD figure.

Also, the attribute of the second character string is a font of the second character string of the CAD figure.

Also, each of the third character strings includes a fourth character string and a fifth character string. The fourth character string identifying a corresponding one of the plurality of parts and the fifth character string indicating an attribute of the corresponding part. The fourth character string and the fifth character string are stored in different fields of the parts list.

Also, the parts list system further includes a part number rule database. The part number rule database stores expression rules of parts. The part table controller refers to the part number rule database to determine whether the fourth character string complies with any of the expression rules, and discards the fourth character string when the fourth character string does not comply with any of the expression rules.

Also, the unit comprises a plurality of sub-units, and at least one of the plurality of sub-units comprises some of the plurality of parts. The expression rules are divided into first and second groups. The first group of expression rules is used to identify the plurality of sub-units, and the second group of expression rules is used to identify the plurality of parts.

Also, the part table controller discards the fourth character string when the fourth character string is not in the parts list.

In another aspect of the present invention, a parts list system includes a figure generator, a method of preparing a parts list for managing parts used for a unit is achieved by generating a CAD figure relating to the unit which comprises a plurality of parts, the CAD figure containing at least a figure of the unit and first character strings; by storing an attribute of at least a second character string relating to each of the plurality of parts in a information database; by extracting as a third character string from the first character strings, the third character string corresponding to the attribute of the second character string; by storing a parts list for managing the parts used for the unit in a part table database; and by registering the third character strings on the parts list.

Also, the attribute of the third character string is a position of the second character string of the CAD figure.

Also, the attribute of the third character string is a font of the second character string of the CAD figure.

Also, each of the third character strings includes a fourth character string and a fifth character string. The fourth character string identifying a corresponding one of the plurality of parts and the fifth character string indicating an attribute of the corresponding part. The fourth character string and the fifth character string are stored in different fields of the parts list.

Also, the method is achieved by storing expression rules of parts in a part number rule database; and by discarding the fourth character string when the fourth character string does not comply with any of the expression rules.

Also, the unit comprises a plurality of sub-units, and at least one of the plurality of sub-units comprises some of the plurality of parts. The expression rules are divided into first and second groups. The first group of expression rules is used to identify the plurality of sub-units, and the second group of expression rules is used to identify the plurality of parts.

Also, the method is achieved by discarding the fourth character string when the fourth character string is not in the parts list.

BRIEF DESCRIPTION OF THE DRAWINGS

FIG. 4 is a view showing an example of a configuration part column of a CAD figure;

FIG. 5 is a view describing a figure database;

FIG. 6 is a view showing an example of a display screen of an electronic parts list;

FIG. 7 is a view describing an electronic parts list of a part table database;

DESCRIPTION OF THE PREFERRED EMBODIMENTS

Here in after, embodiments of a parts list system in the present invention and a method of preparing an electronic parts list will be described in detail with reference to the attached drawings.

This embodiment will be described below by exemplifying a CAD figure and an electronic parts list used in a design for an automobile. However, the parts list system can be applied to a design of a different apparatus provided with a large number of complex parts.

Figure 1:
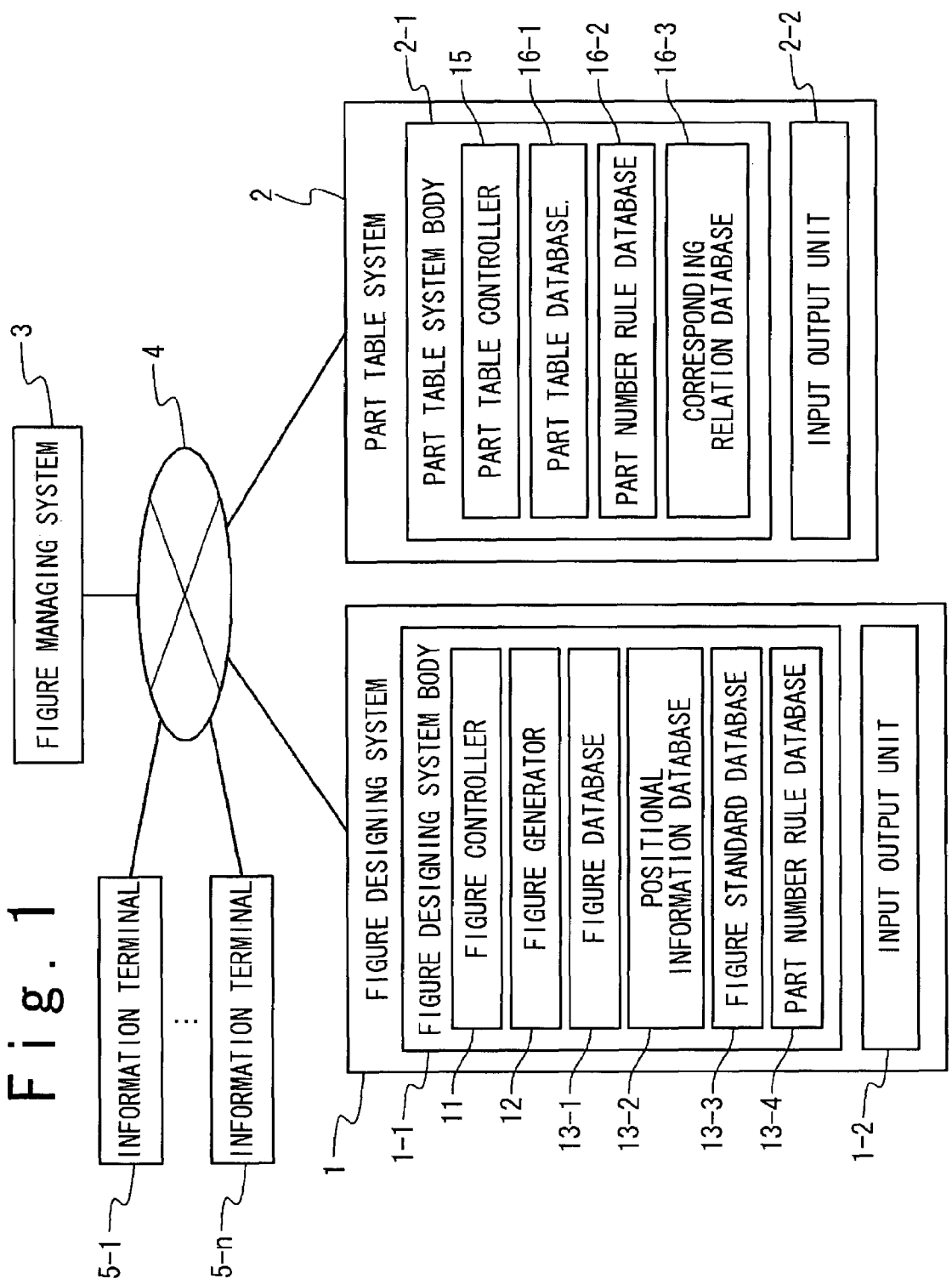
FIG. 1 is a view showing an embodiment of a parts list system in the present invention.

FIG. 1 is a view showing a configuration in an embodiment of a parts list system in the present invention.

The parts list system includes a figure designing system 1, a part table system 2 and a figure managing system 3.

They are connected in two-way communication through a network 4, and they can be accessed from information terminals 5-1 to 5-$n$ connected to the network 4.

In the present invention, the attribute data indicative of a data with regard to a part inputted onto a CAD figure data is read by a computer (a user terminal) from the CAD figure data, and linked to the part table system.

Due to the above-mentioned operation, it is possible to provide a function of automatically checking the attribute data, transferring the data to the part table system and registering the data in the part table. That is, it is possible to automatically make the attribute data of the CAD figure and the attribute data of the part table coincident with each other. Thus, it is possible to reduce labor and time required for a data input and also possible to protect an input miss and the like.

The figure designing system 1 is described.

The figure designing system 1 is the information processor exemplified as a work station and a personal computer. The figure designing system 1 includes a figure designing system body 1-1, and an input output unit 1-2.

The figure designing system body 1-1 has a figure controller 11 serving as a program and a figure generator 12 and contains a figure database 13-1, a positional information database 13-2, a figure standard database 13-3 and a part number rule database 13-4.

The figure generator 12 generates a figure data as a CAD figure (a figure) for a part, in accordance with an input of a designer. The figure generator 12 is exemplified as a CAD figure generation program. The CAD figure is stored in the figure database 13-1.

Here, the figure data (the CAD figure) includes a part number data indicative of a part number of a drawn part, a CAD data indicative of data of two-dimensional (2D) and three-dimensional (3D) figures for the part, a title column data as a data for a title column of the CAD figure and a configuration part column data as a data for a configuration part column of the CAD figure, and the figure data is the data required to constitute the entire CAD figure.

The figure controller 11 extracts the attribute data from the figure data, in accordance with a particular element data. Then, the figure controller 11 outputs the attribute data to the part table system 2 which will be described later.

Also, the figure controller 11 transmits an error indicating that the content of the attribute needs to be changed, to the input output unit 1-2, if an inspection result is not reasonable, in accordance with an inspection data as an inspected result of a matching property of the attribute data outputted from the part table system 2.

Here, the particular element data is the data generated by using a particular element in the figure generator 12. The particular element is the data indicative of a character/symbol of a particular kind used in the figure generator 12, and particular element is exemplified as a data indicative of a font for the particular character/symbol. The attribute data is the data with regard to a part to be noted in the part table (the electronic parts list). The matching property of the attribute data implies the matching between the attribute data extracted from the figure data and the data in the electronic parts list (a kind of the data, a size and the like), the matching between the part number within the attribute data extracted from the figure data and the part number (the part number of a final history) within the attribute data of the electronic parts list, the matching between the part number and the part number rule to define the rule of the assignment of the part number, and the like. If there is the matching property, the attribute data extracted from the figure data can be used in the electronic parts list.

Also, the figure controller 11 can extract the attribute data from the CAD figure (the figure data) in accordance with the positional data and output the attribute data to the part table system which will be described later.

Here, the positional data is indicative of a position on the CAD figure, and the positional data is exemplified as a coordinate on the CAD figure.

The figure controller 11 may be contained in the figure generator 12.

Here, the CAD figure is explained with reference to FIG. 2.

Figure 2:
FIG. 2 is a view showing an example of a CAD figure displayed on a display screen of an input output unit.

FIG. 2 is a view showing a display example of the CAD figure on a display screen of the input output unit 1-2. The CAD figure 20 has a title column region 21, a configuration part column region 22, a figure region 23, a title column 30 and a configuration part column 41.

The title column region 21 is the region in which the title column 30 (which will be described later) is generated. The title column 30 mainly indicates the data to specify a part to be drawn on the figure.

The configuration part column region 22 is the region in which the configuration part column 41 (described later) is generated. The configuration part column 41 mainly indicates the data for a part configuration, such as a part number, a part name and the like, with regard to the part constituting the part to be drawn on the figure.

The figure region 23 is the region in which the 2D figure and the 3D figure are drawn. The 2D figure and the 3D figure are the two-dimensional and three-dimensional figures for the part.

This embodiment is explained by exemplifying the case that the numbers of the title column 30 and the configuration part column 41 are one. However, the present invention is not limited thereto.

The title column 30 is further described.

Figure 3:
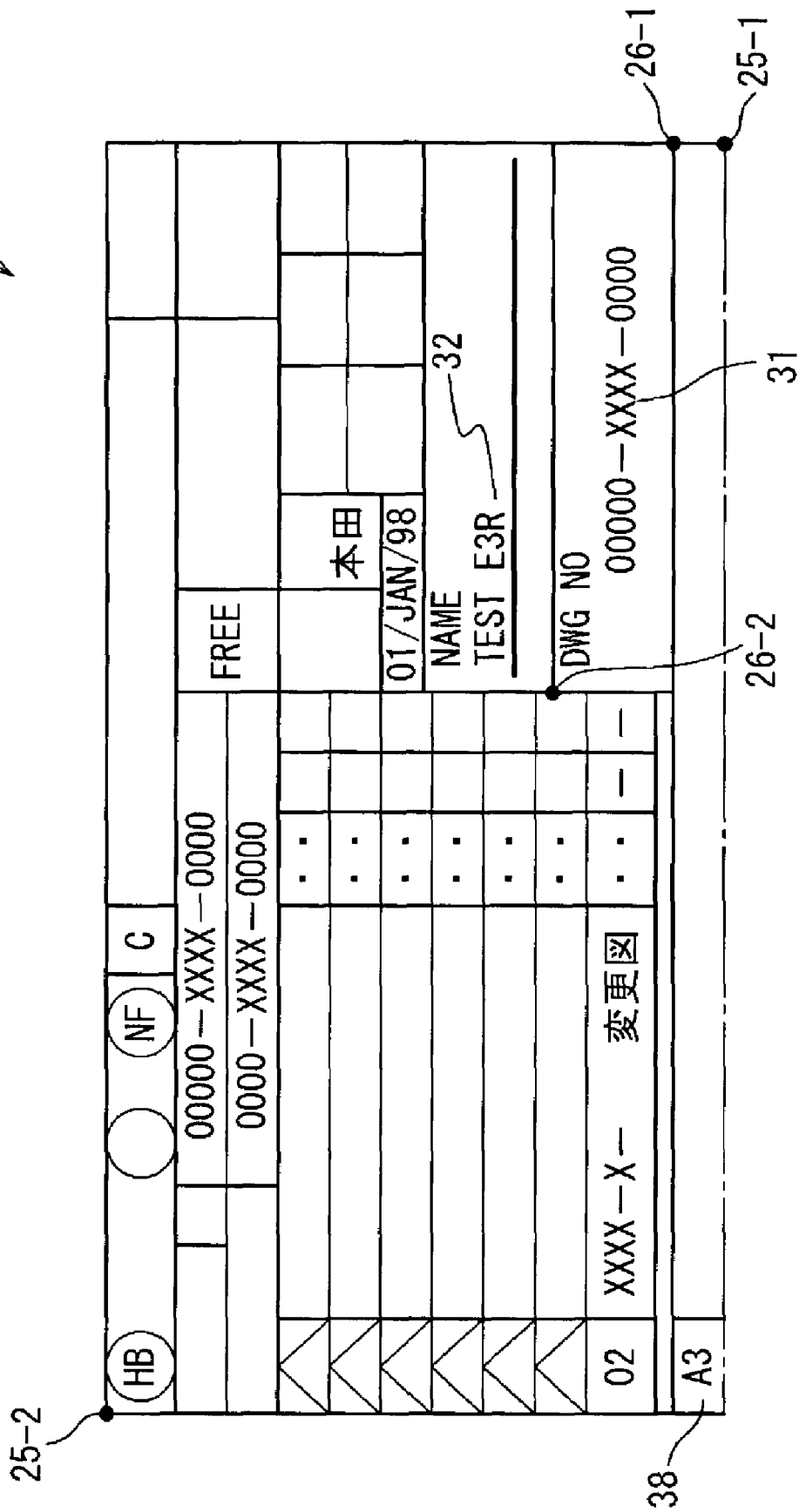
FIG. 3 is a view showing an example of a title column of a CAD figure.

FIG. 3 is a view showing an example of the title column of the CAD figure. The title column 30 has a plurality of data, which are exemplified as a title part number 31, a part name 32, a figure size 38 and the like. Such data are expressed with text data, i.e., character strings. Such data are prepared by using the particular element. Then, all or some of them are extracted as the attribute data and transferred to the part table system.

The configuration part column 41 is further explained.

FIG. 4 is a view showing an example of the configuration part column of the CAD figure. The configuration part column 41 has a plurality of data, which are exemplified as a configuration number 42, a configuration part number 42, a part name 44 and the like. Such data are expressed with text data, i.e., character strings. Such data are prepared by using the particular element. Then, all or some of them are extracted as the attribute data and transferred to the part table system.

The display of the CAD figure as shown in FIG. 2 is one embodiment. The present invention is not limited to the display.

Also, the title column 30 of FIG. 3 and the configuration part column 41 of FIG. 4 are one embodiment. The present invention is not limited to them.

The method of extracting the attribute data in the title column 30 and the configuration part column 41 can use, for example, the following method.

(1) Set in advance the region (the coordinate on the display screen) in which the title column region 21/configuration part column region 22 are generated.

(2) Find out a data group constituted by the particular element within the title column region 21/configuration part column region 22, and extracts two points of positions (coordinates on the display screen) of corners on diagonal lines of the title column 30/configuration part column 41 from a group of line segments surrounding the data group.

For example, in FIG. 3, they are the positions (coordinates) of two points at a corner 25-1 (the lower right) and a corner 25-2 (the upper left). In FIG. 4, they are the positions (coordinates) of two points at a corner 28-1 (the lower right) and a corner 28-2 (the upper left).

(3) Extract the attribute data constituted by the particular element, in accordance with the positional data as the position of each of the attribute data within the title column 30.

For example, in FIG. 3, if the position of the corner 25-1 (the lower right) or the corner 25-2 (the upper left) is defined as a standard, the format of the title column 30 is well known. Thus, it is possible to calculate the regions (that can be specified at positions of two points of a corner 26-1 (the lower right) and a corner 26-2 (the upper left)) in which the title part number 31 that is one of the attribute data is noted. Hence, it is possible to extract the title part number 31 generated by the particular element located in the region.

In FIG. 4, if the position of the corner 28-1 (the lower right) or the corner 28-2 (the upper left) is defined as a standard, the format of the title column 41 is well known. Thus, it is possible to calculate the regions in which the configuration part number 43 that is one of the attribute data is noted. Hence, it is possible to extract the configuration part number 43 generated by the particular element located in the region. The formats of the title column 30 and the configuration part column 41 are stored in the positional information database 13-2.

In the (1), the region in which the title column 30/configuration part column 41 are generated (the title column region 21/configuration part column region 22) are set in advance. However, the region may be not especially set. In that case, in the (2), the region from which the data group constituted by the particular element is retrieved may be defined as the entire CAD figure. The discrimination between the title column 30 and the configuration part column 41 is judged from the arrangement of the particular elements (the arrangement of the attribute data). Consequently, the ranges of the generation regions in the title column 30 and the configuration part column 41 are free to thereby increase the free degree of the generation of the CAD figure.

Also, the positions of the title column 30/configuration part column 41 in the CAD figure can be always set at the constant positions. The positions are stored in the positional information database 13-2. In this case, it is possible to omit the step of specifying the positions of the title column 30/configuration part column 41 at the (2). Thus, the extracting time can be reduced.

Also, the extracted attribute data may be converted into text data. In this case, a size of the attribute data is miniaturized, which results in the reductions in a time and a load on the system when the attribute data is transferred.

With reference to FIG. 1, the figure database 13-1 stores the figure data while the figure data is correlated to the part number data.

The data with regard to the CAD figure stored in the figure database 13-1 is further explained.

FIG. 5 is a view explaining the figure database 13-1. The figure database 13-1 has a part number 61, a title column 62, a configuration part column 63 and a CAD data 64.

The part number 61 indicates the part number data (=the title part number 31) of the part to be drawn on the CAD figure.

The title column 62 is the attribute data extracted from the title column 30 exemplified in the title column part number 31 (62-1), the part name 32 (62-2) and the like.

The configuration part column 63 is the attribute data extracted from the configuration part column 41 exemplified in the configuration number 42 (63-1), the configuration part number 43 (63-2), the CAD data 44 and the like.

The CAD data 64 is the CAD data indicating the 2D and 3D figures of the part of the part number 61. The CAD data 64 may be obtained from the design data of another model that was already designed or may be independently designed by the designer.

With reference to FIG. 1, the positional information database 13-2 stores the description columns of the respective attribute data in the title column 30 and the configuration part column region 21 in the CAD figure 20, and the description columns of the respective attribute data in the configuration part column 41 and the configuration part column region 22, and the figure region 23 and their coordinates in the CAD figure 20 while they are correlated to each other. However, the description columns of the respective attribute data in the title column 30 and the description columns of the respective attribute data in the configuration part column 41 are the above-mentioned relative coordinates.

The figure standard database 13-3 stores the predetermined figure standard data.

The part number rule database 13-4 stores the part number rule, i.e., the expression rule to define the rule with regard to the assignment of the part number.

The input output unit 1-2 is conventionally the input output unit used for a work station and a personal computer. The input unit is exemplified as a keyboard and a mouse, and the output unit is exemplified as a display and a printer.

The figure managing system 3 is exemplified as a work station and a personal computer, and the figure managing system 3 is the information processor that can access the figure designing system 1, the part table system 2 and the information terminals 5-1 to 5-n through the network 4. The information terminals 5-1 to 5-n carry out the admission and the management of a figure.

The part table system 2 will be described below.

The part table system 2 is the information processor exemplified as a work station and a personal computer. The part table system 2 has a part table system body 2-1 and an input output unit 2-2.

The part table system body 2-1 contains a part table controller 15 as a program, and has a part table database 16-1 and a part number rule database 16-2.

The part table controller 15 inspects the matching property of the attribute data, in accordance with the attribute data outputted from the figure designing system 1. The part table controller 15 registers the attribute data in the electronic parts list (the part table) if the attribute data is judged to be reasonable, from the inspected result. Then, the part table controller 15 outputs the inspection result data as the inspected result to the figure designing system 1. The electronic parts list is stored in the part table database 16-1.

Here, the electronic parts list is the part table that is prepared and used by an electronic method. The electronic parts list includes: an item data (an item number (an item), a name) as an item indicative of a configuration (a set of parts) having a certain function; a part number data (part numbers (PNs), names) as numbers individually assigned to the parts constituting the item, one by one; a state data indicative of a progress state of a design with regard to each of the parts; and a part application data, a part configuration data, a part number position shape link data and the like, corresponding to the part number.

Then, parts represented by part numbers are classified into a hierarchy for each item and arranged in a tree structure. For example, with regard to one item, a part (a part number) of a first hierarchy is correlated to a tree of the first hierarchy, and a part (a part number) of a second hierarchy constituting the part of the first hierarchy is correlated to a tree of the second hierarchy of a lower order of the first hierarchy. Hereafter, they are similarly correlated. In this case, the part of the first hierarchy is a master, and the part of the second hierarchy is a slave.

However, the part application data is the data to indicate a combination of mechanisms (options) in which a part is used. The part configuration data is the data peculiar to a part, such as (a part number), a part name, a number of parts, a material quality, a weight, a volume, a cost, a part analyzing method, a desirable part maker and the like. The part position shape link data is the data to correlate a part number on the electronic parts list and a part position shape data stored in a different location to each other. And, the part position shape data is the data (also referred to as a 3D (three-dimensional) data) indicative of a part mount position and a part shape, and the part position shape data is stored in the figure database.

The part table database 16-1 stores the electronic parts list. The electronic parts list is opened to the persons concerned in the development (for example, an engineer, a person in charge of a research, a person in charge of a technical evaluation, a different designer, a person in charge of a purchase, a person in charge of PL, and the like). The reception of an opinion data as an opinion about the electronic parts list from the concerned person can be carried out by a method of allowing only a writing to a special region within the electronic parts list or annexing an attached file or establishing a link with a file of the opinion data.

The part number rule database 16-2 stores a part number rule to define a rule with regard to an assignment of a part number.

A corresponding relation database 16-3 stores: each of the attribute data (containing a title part number 62-1, . . . /configuration number 63-1, . . . ,; a kind of a data, and a size) in the title column 30 (the title column 62 of the figure database 13-1) of the CAD figure 20 and the configuration part column 41 (the configuration part column 63 of the figure database 13-1); and each of the attribute data (containing a hierarchy 71 of the part table database 16-1, a state 72, . . . ; a kind of a data, and a size) in the electronic parts list, while they are correlated to each other.

The designer can view the opinion data indicated by the attached file described by the concerned person or the file of the link destination by opening the electronic parts list. That is, the opinion data of the concerned person can be easily checked on the electronic parts list. Thus, it is possible to decrease the time and the labor, and also possible to reduce the possibility of an oversight.

Here, the electronic parts list is further explained with reference to FIG. 6.

FIG. 6 is a view showing an example of a display screen of the electronic parts list. A display screen 50 includes: a part number display 51 having a number 53, a hierarchy 54, a state 55, a part configuration 56 and an item part name 57; and a configuration information display 52.

The part number display 51 displays the data to specify a part. That is, the number 53 (represented by No.) indicates a symbol based on a predetermined rule, the hierarchy 54 (represented by LVL) indicates the number of the above-mentioned hierarchy, the state 55 indicates the state data of the part, the part configuration 56 indicates a part number of each hierarchy represented in a form of a tree or an item, and the item part name 57 indicates the name of the item or the part, respectively.

The configuration information display 52 displays the part application data of the part, the part configuration data, the part number position shape link data and the other data with regard to the part, for each part.

The part configuration 56 has the tree structure as mentioned above. For example, below an item 56-1 (In FIG. 6, F01 2001), a part number 56-2 of a first hierarchy and a part number 56-3 of a second hierarchy (there is not a third hierarchy in FIG. 6) are represented in the tree structure. That hierarchy is represented in the hierarchy 54.

By the way, the display of the electronic parts list as shown in FIG. 6 is one embodiment. The display screen of the electronic parts list is not limited to the display of the electronic parts list as shown in FIG. 6.

The part table database 16-1 will be further described. The part table database 16-1 stores the electronic parts list, in which a part number and various data with regard to a part indicated by the part number are correlated.

FIG. 7 is a view illustrating the electronic parts list of the part table database 16-1. The electronic parts list has a plurality of fields in which a plurality of data are stored respectively. The plurality of data are exemplified as a hierarchy 71, a state 72, an item number 73, an item name 74, a part number 75, a part number name 76, an application 77, and a part configuration 78 . . . .

The kinds and the numbers of the data are not limited to the above-mentioned examples. They can be changed as necessary.

The hierarchy 71 corresponds to the hierarchy 54, and the state 72 corresponds to the state 55. The item number 73 corresponds to the item number of the part configuration 56. The item name 74 corresponds to the item number of the item part name 57. The part number 75 corresponds to the part number of the part configuration 56. The part number name 76 corresponds to the part name of the item part name 57. The application 77 is the part application data, and, the part configuration corresponds to the part configuration data.

As such data, the respective attribute data in the title column 30 of the CAD figure 20 and the configuration part column 41 are used.

The electronic parts list may be prepared for each classification or may be collectively prepared for each model. Here, the classification implies a family (for example, a frame, an engine, a transmission and the like), a model (for example, a car model), a section (for example, a roof) and an item (for example, a sun roof).

The information terminals 5-1 to 5-n (n=1, 2, . . . ) are exemplified as a work station and a personal computer, and they are the information processing terminals that can access the figure designing system 1, the part table system 2 and the figure managing system 3 in the parts list system through the network 4. The persons concerned in the development use them to access the parts list system. The parts list system can be directly used.

The network 4 is the dedicated line exemplified as LAN (Local Area Network) or the communicable line, such as a public line and the like, exemplified as the Internet.

An embodiment of a preparing method (an operation in the parts list system) of the electronic parts list in the present invention will be described below with reference to the attached drawings.

Figure 8:
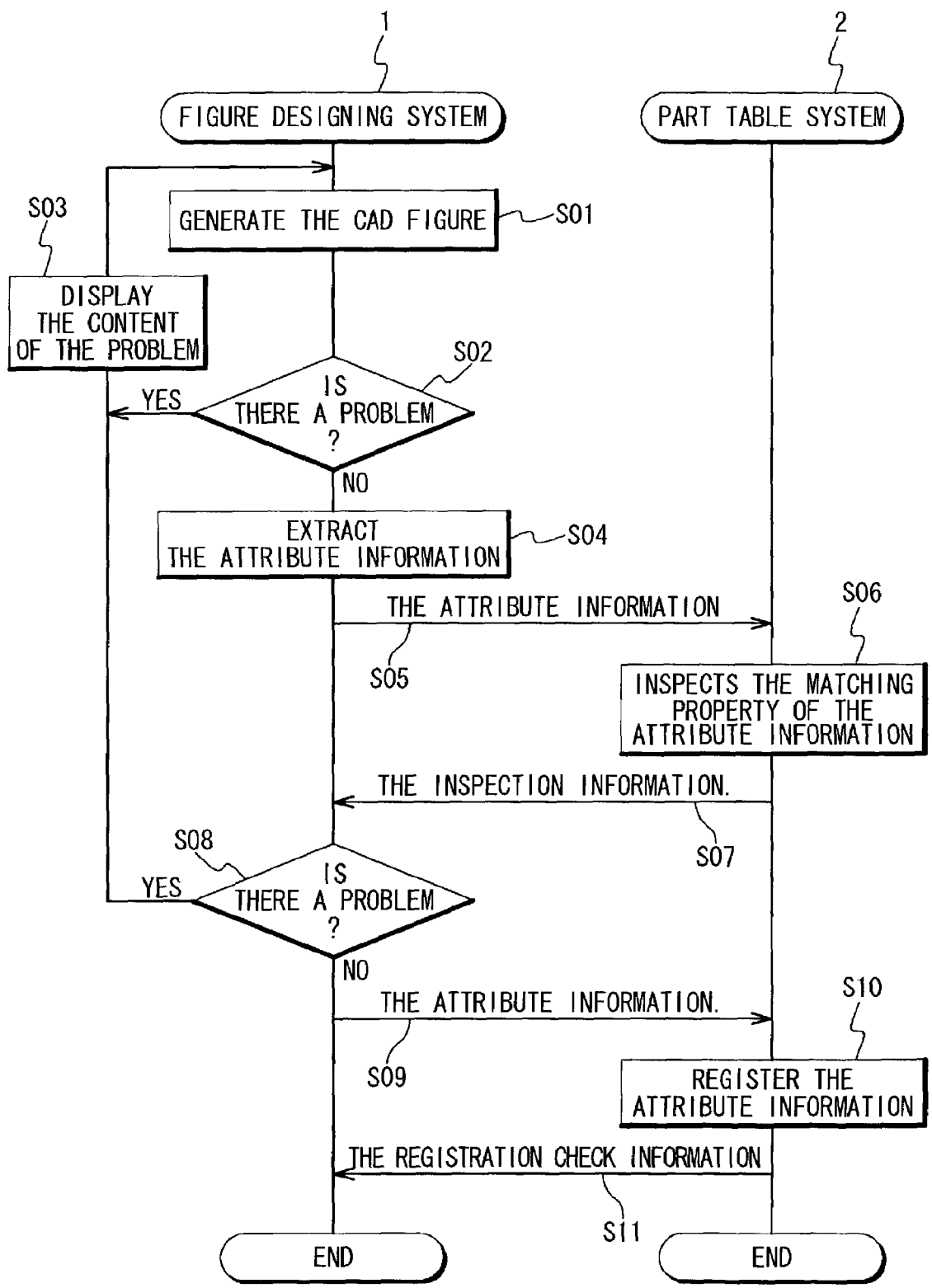
FIG. 8 is a flowchart showing an embodiment of a method of preparing an electronic parts list in the present invention.

FIG. 8 is a flowchart showing one embodiment of the preparing method (the operation in the parts list system) of the electronic parts list in the present invention.

(1) Step S01.

A designer schedules a design change of apart, on the basis of the references of the various data and the independent consideration and the like. The designer generates a CAD figure with the figure designing system 1 according to the rules stored in the positional information database 13-2 or part number rule database 16-2. Moreover, the designer modifies the CAD figure with the figure designing system 1. The figure generator 12 generates the figure or modifies the figure, in accordance with the input with regard to the part design or the design change done on the basis of the schedule of the designer. Incidentally, in the case of the figure modification, after the figure of the part is read out from the figure database, the modification is done on the basis of the input of the designer.

(2) Step S02

The figure controller 11 inspects whether or not the figure complies with a predetermined standard. The predetermined standard is stored in the figure standard database 13-3.

If the figure complies with the standard, this leads to the completion of the figure. The operational flow proceeds to a step S04. If the figure does not comply, the operational flow proceeds to a step S03.

(3) Step S03

Since there is a problem, the figure controller 11 performs the display indicative of its fact, the occurrence location of the problem and its reason, to the designer.

The designer modifies the figure on the basis of the content. The operational flow returns back to the step S01.

(4) Step S04

The figure controller 11 extracts the attribute data from the title column 30 and the configuration part column 41 in the CAD figure 20. That is, the figure controller 11 extracts the part number and the attribute data from the CAD figure 20. The extracting method is as mentioned above.

(5) Step S05

The figure controller 11 transmits the attribute data to the part table system 2. The part table controller 15 of the part table system 2 receives the attribute data. At this step, it is not necessary to transmit all of the attribute data. It is enough to transmit the attribute data targeted for the inspection with regard to the matching property of the attribute data. Thus, a communication speed and a processing become faster.

(6) Step S06

The part table controller 15 specifies the attribute data, in accordance with the correlation between the respective attribute data of the CAD figure 20 in the corresponding relation database 16-3 and the respective attribute data of the electronic parts list. Then, the part table controller 15 inspects the matching property of the attribute data. That is, the part table controller 15 inspects the part number and the attribute data extracted at the step S04. The inspection, which is effectively a test for consistency, is exemplified as the matching between the attribute data of the figure data and the attribute data of the electronic parts list, the matching between the part number of the attribute data in the figure data and the part number of the attribute data in the electronic parts list (the part number of a final history) and the matching between the part number and the part number rule. Among them, the matching between the part number and the part number rule includes: the subjects as to (a) whether or not the part number complies with the part number rule, (b) whether or not there is a parent (a part and an item of a higher order hierarchy), (c) whether or not the part number of the higher order hierarchy is used in the lower order hierarchy, (d) whether or not the same item/part number (including a different model) is used, and (e) whether or not a division figure is prepared. The subject (a) is judged in accordance with the part number rule database 16-2. The subjects (b) to (e) are judged in accordance with the part table database 16-1.

The inspection may be performed on the other attribute data. For example, whether or not an essential data is omitted is inspected.

(7) Step S07

The part table controller 15 transmits the inspected result of the matching property of the attribute data to the figure designing system 1. The figure controller 11 of the figure designing system 1 receives the inspection data. The inspection data shows whether or not the part number complies with the expression rules, whether or not the part number is stored in the part table database 16-1.

(8) Step S08

The figure controller 11 outputs the attribute data, if there is the matching property, in accordance with the inspection data. If there is not the matching property, the operational flow proceeds to the step S03. That is, the figure designing system 1 discards the part number and the attribute data extracted at the step S04 and modifies the CAD figure, when the part number does not comply with the expression rules, or when the part number is not stored in the part table database 16-1.

(9) Step S09

The figure controller 11 transmits the attribute data to the part table system 2. The part table controller 15 of the part table system 2 receives the attribute data. That is, the figure designing system 1 transmits the attribute data, when the part number complies with the expression rules, or the part number is stored in the part table database 16-1.

(10) Step S10

The part table controller 15 registers the received attribute data in a region of a proper part of the electronic parts list in the part table database 16-1. The region of the proper part is retrieved, for example, on the basis of the coincidence of the part number. Also, the correlation between the respective attribute data of the CAD figure 20 and the respective attribute data of the electronic parts list is set in accordance with the corresponding relation database 16-3.

Then, after the registration is ended, the part table controller 15 outputs a registration check data indicative of the end of the registration.

(11) Step S11

The part table controller 15 transmits the registration check data to the figure designing system 1. The figure controller 11 of the figure designing system 1 receives the registration check data.

By the way, at the step S05, it is not necessary to transmit all of the attribute data. It is enough to transmit only the attribute data targeted for the inspection (the step S06) with regard to the matching property of the attribute data. Thus, the communication speed and the processing become faster.

Also, at the step S06, the inspection data may include the part number (the title part number 31) in which the matching property is checked. In this case, at the step S08, the figure controller 11, when receiving the inspection data, receives the part number (the inspection data). Then, the figure controller 11 may further check the part number, in accordance with the part number rule (a viewpoint and a subject which are different from the subject checked in the part number rule database 16-2) of the part number rule database 13-4. In this case, since the check of the part number is done a plurality of times, the value of the part number can be made more accurate. Then, if there is a problem, the operational flow returns back to the step S03.

The check of the above-mentioned additional part number and the like may be further done, for example, immediately before the registration at the step S10. The content of the check may be identical or different. If there is a problem, the operational flow returns back to the step S03 (not shown). In this case, since the check of the part number is done a plurality of times, the value of the part number can be made more accurate.

As the examples of the respective checks, there are the checks as to whether or not the revision of the figure of the same part causes the old part number or figure to be left, whether or not all of the figures and all of the part numbers are correlated to each other, and the like.

The above-mentioned processes enable the designer (the person generating the figure) to automatically carry out the process for registering the attribute data of the CAD figure in the electronic parts list without substantially carrying out the adding work except the generation of the CAD figure.

That is, a dedicated operator is not needed, and the cost and the time can be made effective. The attribute data uses the data on the CAD figure in its original state, and the matching property is automatically checked, which enables the possibility of the erroneous registration to be extremely reduced. Since the obtainment and the registration of the attribute data are automatically done, they can be done accurately and collectively. The elements in relation to the figure data on the CAD data can be precisely modified and made uniform.

Also, the following processes enable the designer to automatically carry out the process for registering the attribute data of the CAD figure in the electronic parts list without substantially carrying out the adding work except the generation of the CAD figure.

Figure 9:
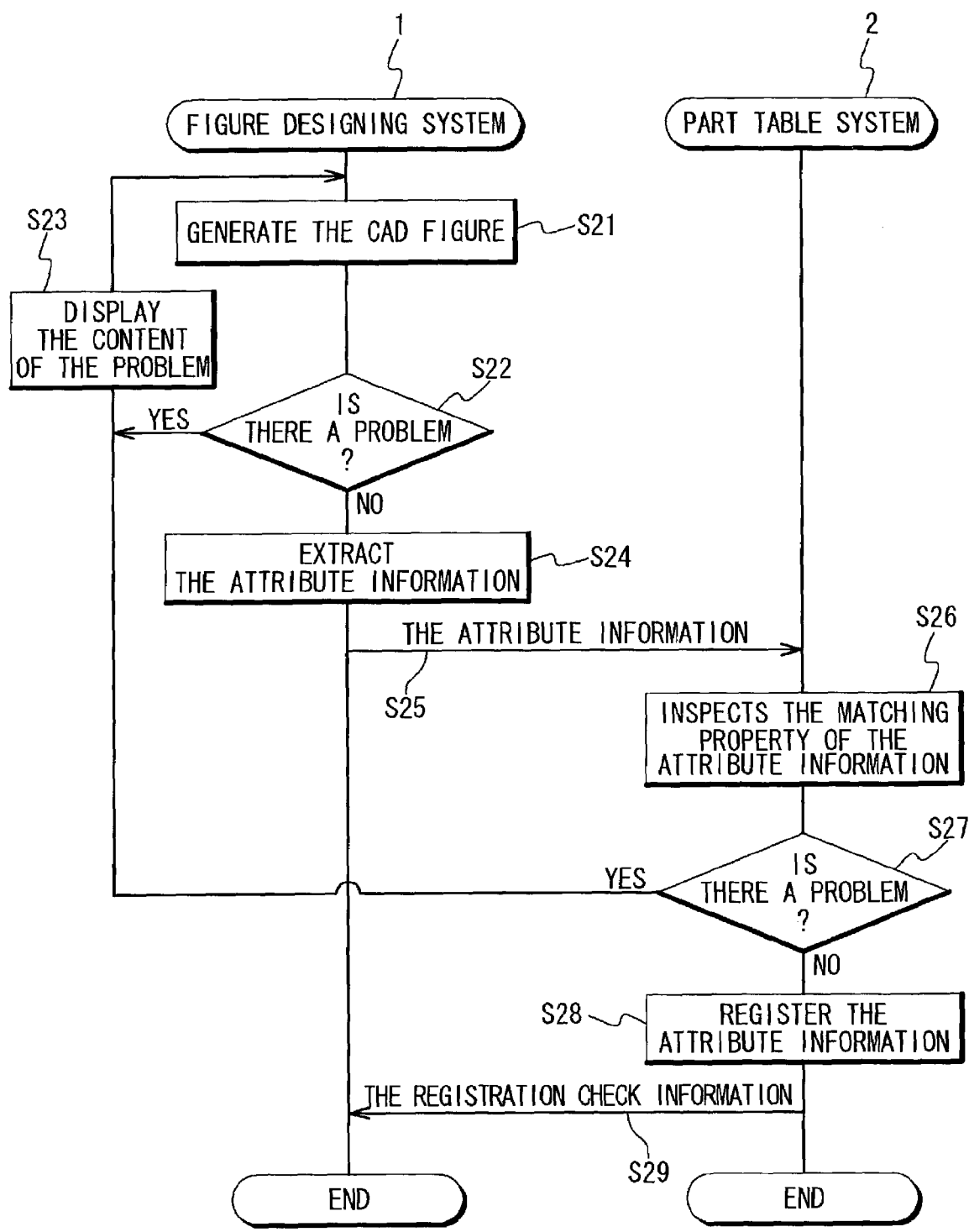
FIG. 9 is a flowchart showing another embodiment of a method of preparing an electronic parts list in the present invention.

FIG. 9 is a flowchart showing another embodiment of the method of preparing the electronic parts list in the present invention.

(1) Steps S21 to S26.

The steps S21 to S26 are equal to the above-mentioned steps S01 to S06.

(7) Step S27

In the part table controller 15, if there is the matching property in accordance with the inspection data that is the inspection result of the matching property of the attribute data, the operational flow proceeds to a Step S28. If there is not the matching property, the operational flow proceeds to the step S23. That is, the figure designing system 1 discards the part number and the attribute data extracted at the step S24 and modifies the CAD figure, when the part number does not comply with the expression rules, or when the part number is not stored in the part table database 16-1.

(8) Step S28

The part table controller 15 registers the attribute data received at the step S25 in the region of the proper part of the electronic parts list in the part table database 16-1. The region of the proper part is retrieved, for example, on the basis of the coincidence of the part number. Also, the correlation between the respective attribute data of the CAD figure 20 and the respective attribute data of the electronic parts list is set in accordance with the corresponding relation database 16-3.

Then, after the registration is ended, the part table controller 15 outputs the registration check data indicative of the end of the registration.

(9) Step S29

The part table controller 15 transmits the registration check data to the figure designing system 1. The figure controller 11 of the figure designing system 1 receives the registration check data.

At the process of FIG. 9, the number of the transmissions of the attribute data is reduced in comparison with the process of FIG. 8. Thus, the time can be shortened.

By the way, at the step S27, the figure controller 11 may further check the part number, in accordance with the part number rule (a viewpoint and a subject which are different from the subject checked in the part number rule database 16-2) of the part number rule database 13-4. In this case, the check of the part number is made more accurate. If there is a problem, the operational flow returns back to the step S23.

According to the present invention, the extraction of the attribute data from the CAD figure data, the matching property check of the attribute data resulting from the linkage to the electronic parts list (the part table) and the automatic registration in the electronic parts list of the attribute data can be executed by the designer (the person generating the figure)

Thus, it is possible to solve the problems, such as the maintenance of the dedicated operator (the worker for registering in the technical part table), the drop in the accuracy caused by the erroneous registration of the attribute data in the electronic parts list, the delay of the registration processing time of the attribute data in the electronic parts list, and the like.

Also, the linkage between the data of the CAD figure and the data of the electronic parts list (the part table) is done only at the stage of the matching property check after the generation of the CAD figure. Both of the data are not always correlated to each other. If they are always correlated, it is necessary to carry out the correlating process when the CAD figure is re-used. However, in the present invention, it is not necessary to carry out the correlating process. Thus, the free degree of the re-use of the figure becomes higher.

On the other hand, both of the data may be always or gently correlated. In this case, when the part number or the like is changed, by changing one data, even the other data can be changed at the same time. Thus, the labor is not required when the data is rewritten. It is possible to largely reduce the occurrences of the forgetfulness of the change, the change miss and the like.

Also, in association with the above-mentioned operation, the attribute extraction condition from the data of the CAD figure can be evident to thereby made uniform the elements in relation to the attribute data on the data of the CAD figure. That is, the writing manner of the CAD data is made uniform independently of the designer. Thus, it is possible to improve the usability by another person of the CAD figure and improve the re-usability. In addition, when the figure data in the data of the CAD figure is collectively re-written, it is possible to improve the collective conversion accuracy.

In the present invention, the electronic parts list is opened. Thus, the data and the data in relation to the development can be opened (disclosed) to the persons in relation to the development without any omission. Hence, the opinion can be widely obtained at the suitable timing from the persons in relation to the development.

As described above according to the parts list system of the present invention, it is possible to carry out the process for automatically extracting the attribute data from the CAD figure data and automatically registering the attribute data in the part table.

Although there have been described what are the present embodiments of the invention, it will be understood by persons skilled in the art that variations and modifications may be made thereto without departing from the spirit or essence of the invention.

What is claimed is:

1. A system for automatically extracting new information inputted on a computer aided design (CAD) figure, inspecting the extracted information, and registering the validated information in a parts list, the system comprising:
    at least one computer processor and at least one application executed by said at least one computer processor, collectively defining:
    a figure generator which inputs new information into the system, wherein the input new information is incorporated into a CAD figure generated by said figure generator, said generated CAD figure relating to a unit which comprises a plurality of parts, said generated CAD figure containing at least a figure of said unit and first character strings, the first character strings comprising part data provided on the generated CAD figure;
    an information database which stores an attribute of at least a second character string relating to each of said plurality of parts, the attribute of the at least a second character string comprising at least one of positional information and font information of the part data provided on the generated CAD figure;
    a figure controller which automatically extracts the input new information in a form of a third character string, comprising desired part data, from said first character strings, said third character string corresponding to said attribute of said at least a second character string, wherein the figure controller uses one of positional information and font information to locate desired part data on the figure,
    at least one of said figure controller and a part table controller automatically inspects said third character string to determine if said third character string is reasonable for registering;
    a part table database which stores a parts list for managing said plurality of parts of said unit; and
    said part table controller which automatically registers said third character string on said parts list in response to determining that said third character string is reasonable for registering.

2. The system according to claim 1, wherein said third character string includes a fourth character string and a fifth character string, said fourth character string identifying a corresponding one of said plurality of parts and said fifth character string indicating an attribute of said corresponding part, and said fourth character string and said fifth character string are stored in different fields of said parts list.

3. The system according to claim 2, further comprising:
    a part number rule database which stores expression rules of parts,
    wherein said part table controller refers to said part number rule database to determine whether said fourth character string complies with any of said expression rules, and discards said fourth character string and outputs an indication of a problem to said figure generator when said fourth character string does not comply with any of said expression rules.

4. The system according to claim 3, wherein said unit comprises a plurality of sub-units, and at least one of said plurality of sub-units comprises some of said plurality of parts, said expression rules are divided into first and second groups, said first group of expression rules is used to identify said plurality of sub-units, and said second group of expression rules is used to identify said plurality of parts.

5. The system according to claim 2, wherein each of said third character strings includes only one said fourth character string and only one said fifth character string.

6. The system according to claim 1, wherein
the figure controller is configured to search a specific portion of the CAD figure based on positional information indicative of a portion of the generated CAD figure, to extract the desired part data located in said specific portion as an attribute data from said generated CAD figure, and to output at least a portion of said attribute data to the part table controller;
the part table controller is configured to automatically inspect for consistency between said attribute data output by the figure controller and data of said parts list, and to output a test resultant data to said figure controller,
wherein said figure controller again outputs said attribute data to said part table controller based on said test resultant data when said attribute data is determined to be consistent, and
said part table controller automatically registers said consistent attribute data on said parts list.

7. The system according to claim 6, wherein said part table controller tests consistency between a part number of said attribute data output by the figure controller to data of said parts list, and to a part number rule which defines allocation of a part number.

8. The system according to claim 1, wherein said figure controller converts said third character string into text data after extracting the third character string and thereafter transfers the text data to the part table controller.

9. The system according to claim 1, further comprising a figure standard database storing a predetermined standard for CAD figures generated by said figure generator, wherein said figure controller determines whether the generated CAD figure complies with said predetermined standard before the figure controller extracts the third character string.

10. A method of preparing a parts list for managing parts a unit comprising a plurality of parts, in which new information inputted on a computer aided design (CAD) figure is automatically extracted, inspected, and registered in the parts list, comprising:
generating, by a computer system, a CAD figure relating to said unit which comprises said plurality of parts, said generated CAD figure containing at least a figure of said unit and first character strings, the first character strings comprising part data provided on the generated CAD figure;
inputting new information in to the computer system, wherein the input new information is incorporated into the generated CAD figure;
automatically storing an attribute of at least a second character string relating to each of said plurality of parts in an information database, the attribute of at least a second character string comprising at least one of positional information and font information of the part data provided on the generated CAD figure;
automatically extracting the input new information in a form of a third character string, comprising desired part data, from said first character strings, said third character string corresponding to said attribute of said second character string, wherein one of positional information and font information is used to locate desired part data on the figure;
automatically inspecting said third character string to determine if said third character string is reasonable for registering,
storing, by the computer system, a parts list for managing said plurality of parts used for said unit in a part table database; and
automatically registering said third character string on said parts list in response to determining that said third character string is reasonable for registering.

11. The method according to claim 10, wherein said third character string includes a fourth character string and a fifth character string, said fourth character string identifying a corresponding one of said plurality of parts and said fifth character string indicating an attribute of said corresponding part, and said fourth character string and said fifth character string are stored in different fields of said parts list.

12. The method according to claim 11, further comprising:
storing expression rules of parts in a part number rule database;
discarding said fourth character string and outputting an indication of a problem when said fourth character string does not comply with any of said expression rules.

13. The method according to claim 12, wherein said unit comprises a plurality of sub-units, and at least one of said plurality of sub-units comprises some of said plurality of parts, said expression rules are divided into first and second groups, said first group of expression rules is used to identify said plurality of sub-units, and said second group of expression rules is used to identify said plurality of parts.

14. The method according to claim 11, wherein each of said third character strings includes only one said fourth character string and only one said fifth character string.

15. The method according to claim 10, wherein said third character string is converted into text data after being extracted, and thereafter the text data is transferred for potential registration in said parts list.

16. The method according to claim 10, further comprising steps of:
storing, in a figure standard database, a predetermined standard for CAD figures; and
determining whether said generated CAD figure complies with said predetermined standard before extracting the third character string.

* * * * *